(12) United States Patent
Lin et al.

(10) Patent No.: US 8,119,465 B1
(45) Date of Patent: Feb. 21, 2012

(54) THIN FILM TRANSISTOR AND METHOD FOR FABRICATING THE SAME

(75) Inventors: Wu-Hsiung Lin, Hsinchu (TW); Ming-Wei Sun, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/041,439

(22) Filed: Mar. 7, 2011

(30) Foreign Application Priority Data

Oct. 26, 2010 (TW) .................................. 99136504

(51) Int. Cl.
*H01L 21/00* (2006.01)
(52) U.S. Cl. .... 438/151; 438/149; 438/586; 257/E21.37
(58) Field of Classification Search .................. 438/161, 438/608; 257/E21.046, E21.062, E21.37, 257/E21.4, E21.457
See application file for complete search history.

(56) References Cited

U.S. PATENT DOCUMENTS

| 2007/0090365 | A1 | 4/2007 | Hayashi et al. |
| 2008/0283843 | A1 | 11/2008 | Kawachi |
| 2009/0068773 | A1 | 3/2009 | Lai et al. |
| 2011/0210347 | A1 * | 9/2011 | Takeguchi ....................... 257/88 |

* cited by examiner

*Primary Examiner* — Cheung Lee
(74) *Attorney, Agent, or Firm* — Jianq Chyun IP Office

(57) ABSTRACT

A method of fabricating a thin film transistor including: forming a gate on a substrate; forming a gate insulation layer on the substrate to cover the gate; forming an oxide semiconductor layer on the gate insulation layer; forming a translucent layer on a partial region of the oxide semiconductor layer; performing an optical annealing process to transform the oxide semiconductor layer into an oxide channel layer and two ohmic contact layers by using the translucent layer as a mask, where the oxide channel layer is located under the translucent layer, and the ohmic contact layers are respectively located beside the oxide channel layer and are connected with the oxide channel layer; and forming a source and a drain electrically insulated from each other on the gate insulation layer and the ohmic contact layers.

18 Claims, 11 Drawing Sheets

THIN FILM TRANSISTOR AND METHOD FOR FABRICATING THE SAME

CROSS-REFERENCE TO RELATED APPLICATION

This application claims the priority benefit of Taiwan application serial no. 99136504, filed Oct. 26, 2010. The entirety of the above-mentioned patent application is hereby incorporated by reference herein and made a part of this specification.

BACKGROUND OF THE INVENTION

1. Field of the Invention

The invention relates to a thin film transistor and a method of fabricating the same. More particularly, the invention relates to a thin film transistor having an oxide channel layer and a method of fabricating the same.

2. Description of Related Art

Due to increasing concerns for the environment, flat display panels with superior characteristics such as low consumption power, high space utilization efficiency, free of radiation, high image quality and so on have become the main stream in the market. Conventional flat displays include liquid crystal displays, plasma displays, organic electroluminescent displays, and the like. Take the most common liquid crystal displays (LCDs) as an example, each LCD is mainly constituted by a thin film transistor (TFT) array substrate, a color filter substrate, and a liquid crystal layer sandwiched therebetween. In the conventional TFT array substrates, an amorphous silicon (α-Si) TFT or a low temperature polysilicon TFT is usually adopted as a switching device of each of a plurality of sub-pixels. In recent studies, oxide semiconductor TFTs have higher mobility comparing to α-Si TFTs and have better threshold voltage uniformity (Vth) comparing to low temperature TFTs. Thus, oxide semiconductor TFTs have the potential of becoming the key element in flat displays of the next generation.

FIGS. 1A to 1D are schematic cross-sectional diagrams illustrating a flow chart of fabricating a conventional oxide semiconductor TFT. Referring to FIGS. 1A to 1D sequentially, a buffering layer 101 is formed on a substrate 100, a gate 102 is formed on a partial region of the buffering layer 101, and a gate insulation layer 104 is formed entirely on the substrate 100 to cover the gate 102 as shown in FIG. 1A. An oxide semiconductor layer 106 is formed on the gate insulation layer 104 as shown in FIG. 1B. An excimer laser annealing process is performed by using a photomask M as a mask, so that a portion of the oxide semiconductor layer 106 not shielded by the photomask M is transformed into two ohmic contact layers 106b, and a portion of the oxide semiconductor layer 106 shielded by the photomask M retains the characteristics of semiconductors and forms an oxide channel layer 106a. The ohmic contact layers 106b are respectively located beside the oxide channel layer 106a and connected with the oxide channel layer 106a as depicted in FIGS. 1B and 1C. A source S and a drain D electrically insulated from each other are respectively formed on the gate insulation layer 104 and the ohmic contact layers 106b. Accordingly, the fabrication of the conventional oxide semiconductor TFT is complete.

However, the oxide semiconductor TFT fabricated with the process aforementioned has unstable electrical specification (the relationship between drain current and gate voltage). Thus, in known technology, in order for the oxide semiconductor TFT to maintain stable electrical specification, an annealing process such as a thermal annealing process or an excimer laser annealing process is usually performed to the oxide channel layer 106a after the foregoing process for the electrical specification of the oxide semiconductor TFT to be stable. Nevertheless, this process complicates the fabrication of the conventional oxide semiconductor TFT. Accordingly, researchers are trying to enhance the electrical specification of the oxide semiconductor TFT without increasing the complexity of the fabrication.

SUMMARY OF THE INVENTION

The invention is directed to a thin film transistor (TFT) having stable electrical specification.

The invention is directed to a method of fabricating a TFT which facilitates the mass production of the TFT.

The invention is directed to a method of fabricating a TFT, and the method includes the following. A gate is formed on a substrate. Then, a gate insulation layer is formed on the substrate to cover the gate. Next, an oxide semiconductor layer is formed on the gate insulation layer. Afterwards, a translucent layer is formed on a partial region of the oxide semiconductor layer. An optical annealing process is then performed to transform the oxide semiconductor layer into an oxide channel layer and two ohmic contact layers by using the translucent layer as a mask. The oxide channel layer is located under the translucent layer. The ohmic contact layers are respectively located beside the oxide channel layer and connected with the oxide channel layer. A source and a drain electrically insulated from each other are formed on the gate insulation layer and the ohmic contact layers.

The invention is directed to a method of fabricating a TFT, and the method includes the following. A gate is formed on a substrate. Then, a gate insulation layer is formed on the substrate to cover the gate. Next, a source and a drain electrically insulated from each other are formed on the gate insulation layer. Later, an oxide semiconductor layer is formed on the gate insulation layer, the source, and the drain. A translucent layer is next formed on a partial region of the oxide semiconductor layer. Finally, an optical annealing process is performed to transform the oxide semiconductor layer into an oxide channel layer and two ohmic contact layers by using the translucent layer as a mask. The oxide channel layer is located under the translucent layer. The ohmic contact layers are respectively located beside the oxide channel layer and connected with the oxide channel layer.

The invention is directed to a TFT including a gate, a gate insulation layer, an oxide semiconductor layer, a translucent layer, a source, and a drain. The gate insulation layer covers the gate. The oxide semiconductor layer is disposed on the gate insulation layer and located above the gate. The oxide semiconductor layer includes an oxide channel layer and two ohmic contact layers. The ohmic contact layers are respectively located beside the oxide channel layer and connected with the oxide channel layer. The translucent layer is located above the oxide channel layer. The source and the drain are disposed on the gate insulation layer and the ohmic contact layers. The source and the drain are electrically insulated from each other.

The invention is directed to a TFT including a gate, a gate insulation layer, a source, a drain, an oxide semiconductor layer, and a translucent layer. The gate insulation layer covers the gate. The source and the drain are disposed on the gate insulation layer and electrically insulated from each other. The oxide semiconductor layer is disposed on the gate insulation layer, the source, and the drain. The oxide semiconductor layer includes an oxide channel layer and two ohmic contact layers. The ohmic contact layers are respectively located beside the oxide channel layer and connected with the oxide channel layer. The translucent layer is located above the oxide channel layer.

In one embodiment of the invention, a material of the oxide semiconductor layer includes indium gallium zinc oxide (IGZO), indium zinc oxide (IZO), indium gallium oxide (IGO), zinc oxide (ZnO), cadmium oxide.germanium dioxide ($2CdO \cdot GeO_2$), or nickel cobalt oxide ($NiCo_2O_4$).

In one embodiment of the invention, a material of the translucent layer includes silicon oxide ($SiO_x$), silicon nitride ($SiN_x$), titanium oxide ($TiO_x$), indium oxide ($In_2O_3$), $InGaO_3$, InGaZnO, tin oxide ($SnO_2$), ZnO, zinc indium oxide ($Zn_2In_2O_5$), argentum (Ag), zinc tin oxide ($ZnSnO_3$), zinc tin oxide ($Zn_2SnO_4$), or amorphous silicon ($\alpha$-Si).

In one embodiment of the invention, the optical annealing process is performed by irradiating the translucent layer and the oxide semiconductor layer with a laser beam.

In one embodiment of the invention, an energy of the laser beam decays to 10%-90% after the laser beam passes through the translucent layer.

In one embodiment of the invention, the translucent layer includes a translucent light-shielding layer or a translucent light-absorption layer.

In one embodiment of the invention, a sheet resistance of the ohmic contact layers is $Rs1(\Omega/\square)$, a sheet resistance of the oxide channel layer is $Rs2(\Omega/\square)$, and Rs2/Rs1 is about $10^8$.

In one embodiment of the invention, the sheet resistance Rs1 of the ohmic contact layers is about $10^4 \Omega/\square$ and the sheet resistance Rs2 of the oxide channel layer is about $10^{12} \Omega/\square$.

In one embodiment of the invention, in the method of fabricating the TFT, a dielectric layer is formed between the translucent layer and the oxide semiconductor layer before the translucent layer is formed.

The TFT of the invention has stable electrical specification and the fabrication illustrated in the invention is simple and facilitates the mass production of the TFT.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 2E and 2H are schematic cross-sectional diagrams showing the TFT according to the first embodiment of the invention.

FIG. 2I is a schematic cross-sectional diagram showing a TFT according to an embodiment of the invention.

FIGS. 3E and 3H are schematic cross-sectional diagrams showing the TFT according to the second embodiment of the invention.

DESCRIPTION OF EMBODIMENTS

First Embodiment

Figure 1A:
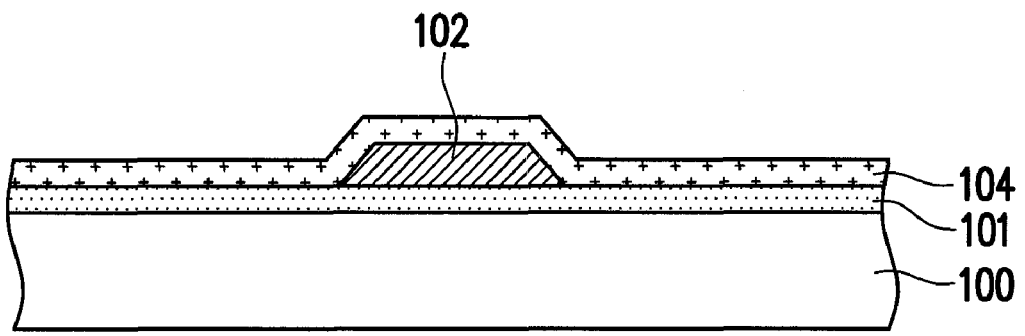
FIGS. 1A to 1D are schematic cross-sectional diagrams illustrating a flow chart of fabricating a conventional oxide semiconductor thin film transistor (TFT).
Figure 1B:
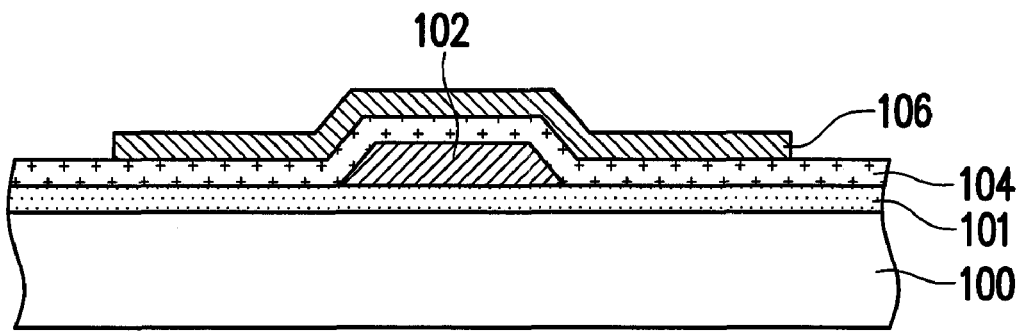
Figure 1C:
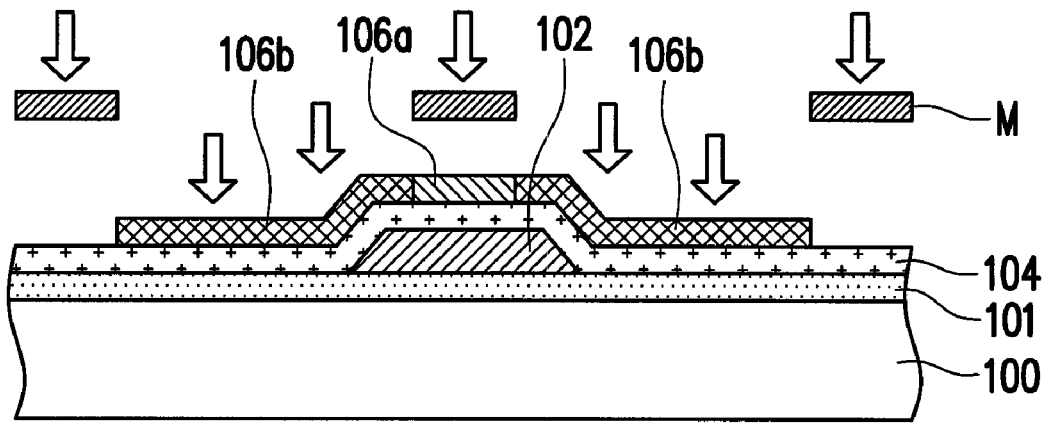
Figure 1D:
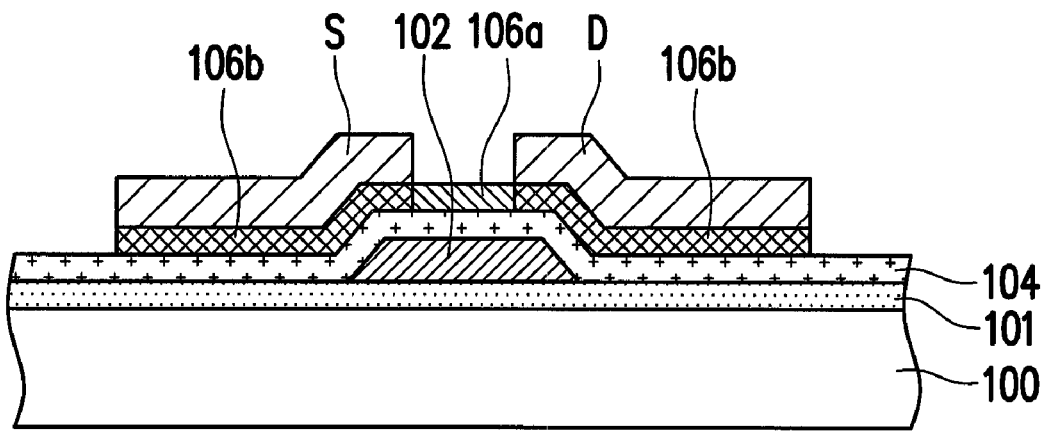
Figure 2A:
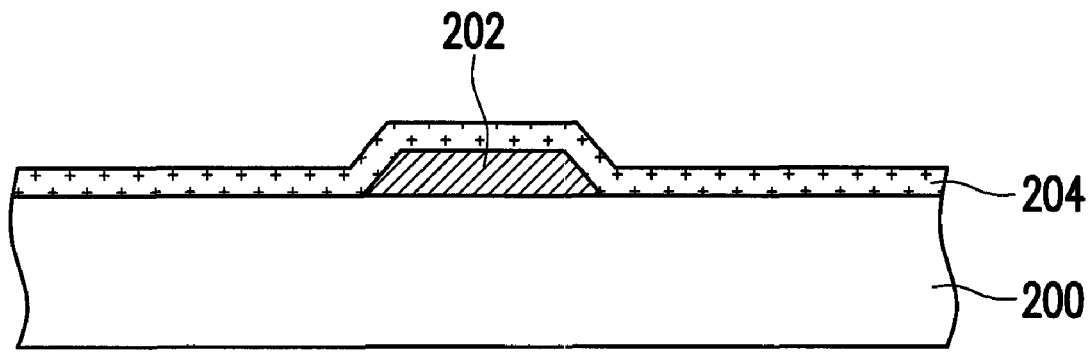
FIGS. 2A to 2E are schematic cross-sectional diagrams showing a flow chart of fabricating a TFT according to a first embodiment of the invention.

FIGS. 2A to 2E are schematic cross-sectional diagrams showing a flow chart of fabricating a TFT according to the present embodiment. Referring to FIG. 2A, a gate 202 is formed on a substrate 200. Next, a gate insulation layer 204 is formed entirely on the substrate 200 to cover the gate 202. In the present embodiment, the substrate 200 is fabricated using, for example, glass, quartz, organic polymer, non-transparent/reflective material (i.e. conductive material, wafer, ceramics and the like), or other suitable material.

In the present embodiment, a material of the gate 202 is generally a metal material. However, the invention is not limited thereto. In another embodiment, the gate 202 can also be fabricated with other conductive material such as an alloy, a nitride of a metal material, an oxide of a metal material, an oxynitride of a metal material, or a stacked layer of a metal material and other conductive material. The gate insulation layer 204 in the present embodiment is fabricated using, for example, an inorganic dielectric material (i.e. silicon oxide, silicon nitride, silicon oxynitride, or a stacked layer including at least two of the above materials), an organic dielectric material, or a combination thereof. However, the invention is not limited thereto.

Figure 2B:
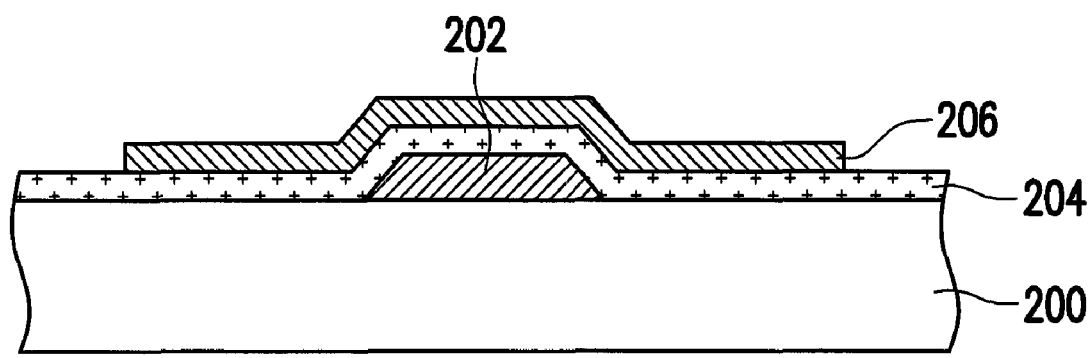

Referring to FIG. 2B, an oxide semiconductor layer 206 is formed on a partial region of the gate insulation layer 204. In the present embodiment, a material of the oxide semiconductor layer 206 includes IGZO, IZO, IGO, ZnO, $2CdO \cdot GeO_2$, $NiCo_2O_4$, or other suitable material.

Figure 2C:
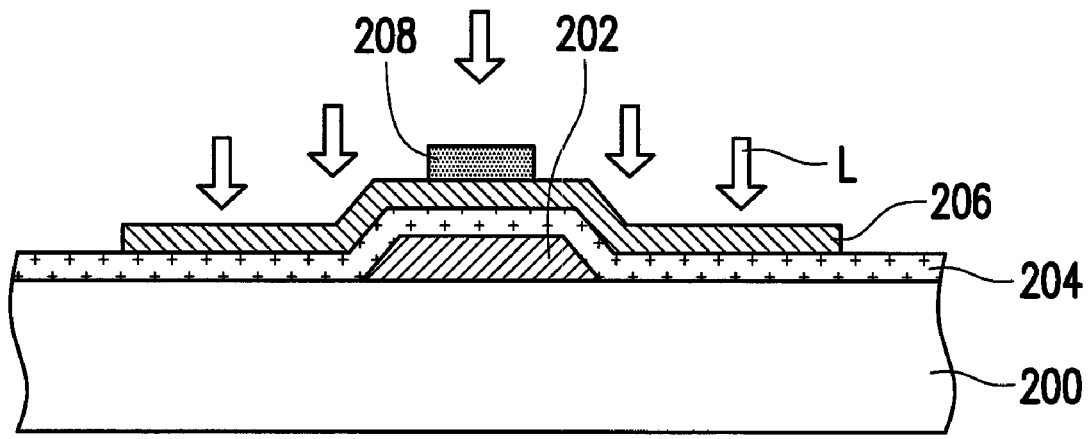

Referring to FIG. 2C, a translucent layer 208 is formed on the partial region of the oxide semiconductor layer 206. In the present embodiment, the translucent layer is, for instance, a translucent light-shielding layer for shielding a portion of an incident light. Nonetheless, the invention is not limited thereto. In other embodiments, the translucent layer can be a translucent light-absorption layer for absorbing a portion of the incident light. In the present embodiment, a material of the translucent layer 208 includes $SiO_x$, $SiN_x$, $TiO_x$, $In_2O_3$, $InGaO_3$, InGaZnO, $SnO_2$, ZnO, $Zn_2In_2O_5$, Ag, $ZnSnO_3$, $Zn_2SnO_4$, or $\alpha$-Si. However, the invention is not limited thereto.

Figure 2D:
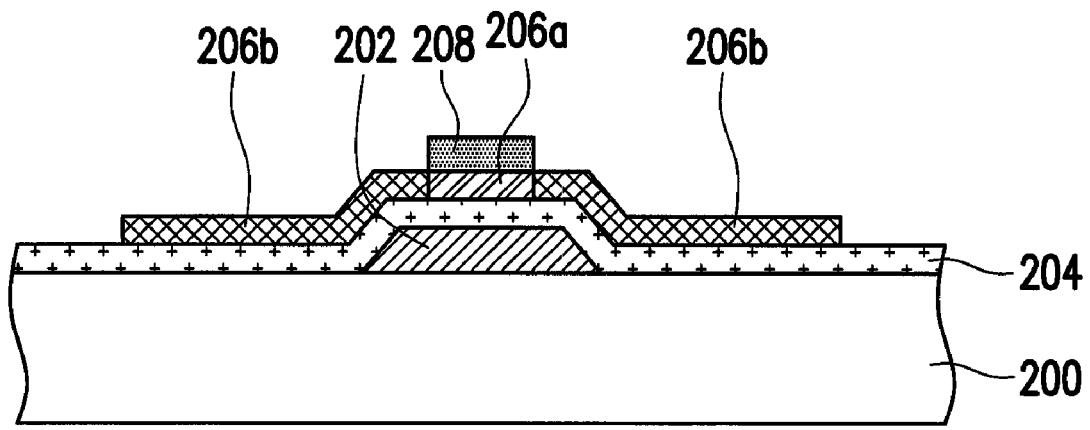

Referring to FIGS. 2C and 2D simultaneously, an optical annealing process is performed to transform the oxide semiconductor layer 206 into an oxide channel layer 206a and two ohmic contact layers 206b by using the translucent layer 208 as a mask, as depicted in FIGS. 2C and 2D. In details, the optical annealing process of the present embodiment is performed by irradiating the translucent layer 208 and the oxide semiconductor layer 206 using a laser beam L, for example. A portion of the oxide semiconductor layer 206 not shielded by the translucent layer 208 receives a greater energy of the laser beam L (about the same as an energy of the incident laser beam L). On the other hand, a portion of the oxide semiconductor layer 206 shielded by the translucent layer 208 receives a smaller energy of the laser beam L. For example, an energy of the laser beam L received by the portion of the oxide semiconductor layer 206 shielded by the translucent layer 208 decays to 10%-90% of the energy of the incident laser beam L.

In the present embodiment, the portion of the oxide semiconductor layer 206 receiving a greater energy of the laser beam L transforms into the ohmic contact layers 206b having a lower resistance, and the portion of the oxide semiconductor layer 206 receiving a smaller energy of the laser beam L transforms into the oxide channel layer 206a having stable electrical specification, as shown in FIG. 2D. Furthermore, when a sheet resistance of the ohmic contact layers 206b is Rs1(Ω/□) and a sheet resistance of the oxide channel layer 206a is Rs2(Ω/□), a ratio Rs2/Rs1 of the sheet resistance Rs2(Ω/□) of the oxide channel layer 206a and the sheet resistance Rs1(Ω/□) of the ohmic contact layers 206b is about $10^8$. Specifically, in the present embodiment, the sheet resistance Rs1 of the ohmic contact layers 206b is about $10^4 Ω/□$, for example, and the sheet resistance Rs2 of the oxide channel layer 206a is about $10^{12} Ω/□$, for example.

It should be noted that in the present embodiment, the translucent layer 208 disposed on the partial region of the oxide semiconductor layer 206 is utilized, so that the portion of the oxide semiconductor layer 206 shielded by the translucent layer 208 and the portion not shielded by the translucent layer 208 can receive different energies of the laser beam L simultaneously. Thus, the oxide channel layer 206a having superior electrical specification and the ohmic contact layers 206b having low resistance are formed simultaneously in the present embodiment. In addition, the thickness or the composition of the translucent layer 208 in the present embodiment can be suitably adjusted to change the ability of translucent layer 208 for decaying the laser beam L, such that the electrical specification of the oxide channel layer 206a can be optimized.

Figure 2E:
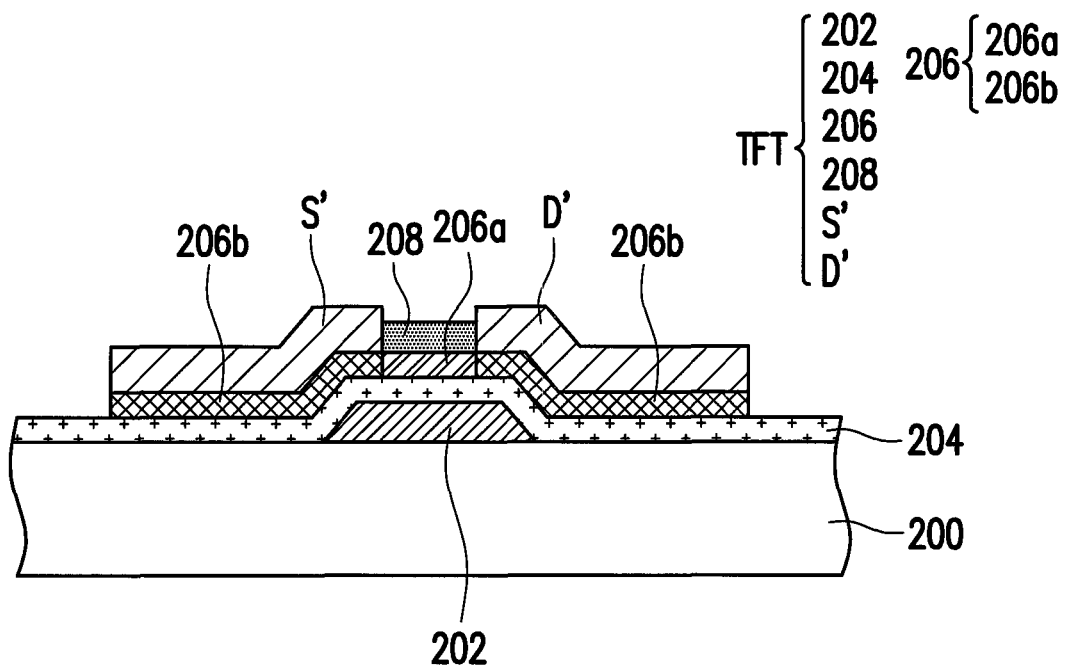

Referring to FIG. 2E, a source S' and a drain D' electrically insulated from each other are formed on the portion of the gate insulation layer 204 and the ohmic contact layers 206b respectively. In the present embodiment, the source S' and the drain D' electrically insulated from each other form a superior ohmic contact respectively with the ohmic contact layers 206b and the oxide channel layer 206a located underneath. In the present embodiment, a material of the source S' and the drain D' is generally a metal material. However, the invention is not limited thereto. In another embodiment, the source S' and the drain D' can also be fabricated with other conductive material such as an alloy, a nitride of a metal material, an oxide of a metal material, an oxynitride of a metal material, or a stacked layer of a metal material and other conductive material.

The fabrication of the TFT in the present embodiment is initially completed after the source S' and the drain D' are fabricated.

As shown in FIG. 2E, the TFT of the present embodiment includes the gate 202, the gate insulation layer 204, the oxide semiconductor layer 206, the translucent layer 208, the source S' and the drain D'. The gate insulation layer 204 covers the gate 202. The oxide semiconductor layer 206 includes an oxide channel layer 206a and two ohmic contact layers 206b. The ohmic contact layers 206b are respectively located beside the oxide channel layer 206a and connected with the oxide channel layer 206a. The oxide semiconductor layer 206 is disposed on the gate insulation layer 204 and the oxide channel layer 206a is located above the gate 202. The translucent layer 208 is located above the oxide channel layer 206a. The source S' and the drain D' are disposed on the gate insulation layer 204 and the ohmic contact layers 206b. The source S' and the drain D' are electrically insulated from each other.

Figure 2F:
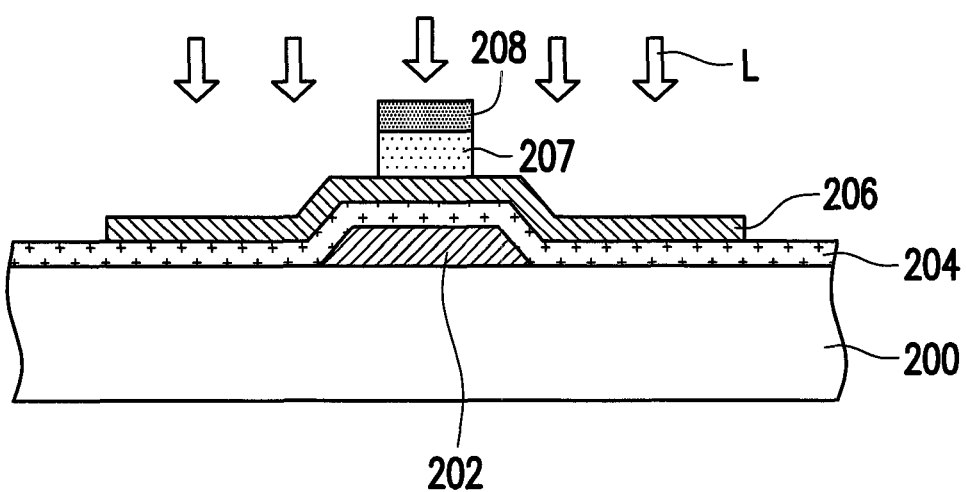
FIGS. 2F to 2H are schematic cross-sectional diagrams showing a flow chart of a partial fabrication of the TFT according to the first embodiment of the invention.

In the present embodiment, a dielectric layer 207 is formed between the translucent layer 208 and the oxide semiconductor layer 206 before the translucent layer 208 is formed, as depicted in FIG. 2F. In the present embodiment, a material of the dielectric layer 207 is a transparent dielectric material, for example, $SiO_x$; however, the invention is not limited thereto.

Figure 2G:
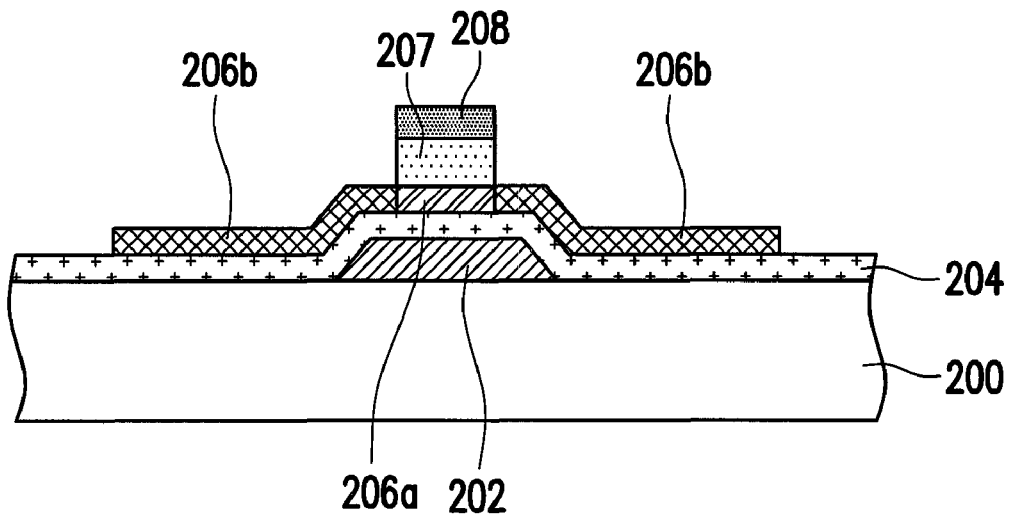

An optical annealing process is performed to transform the oxide semiconductor layer 206 into the oxide channel layer 206a and the two ohmic contact layers 206b by using the translucent layer 208 as a mask, as depicted in FIGS. 2F and 2G.

Figure 2H:
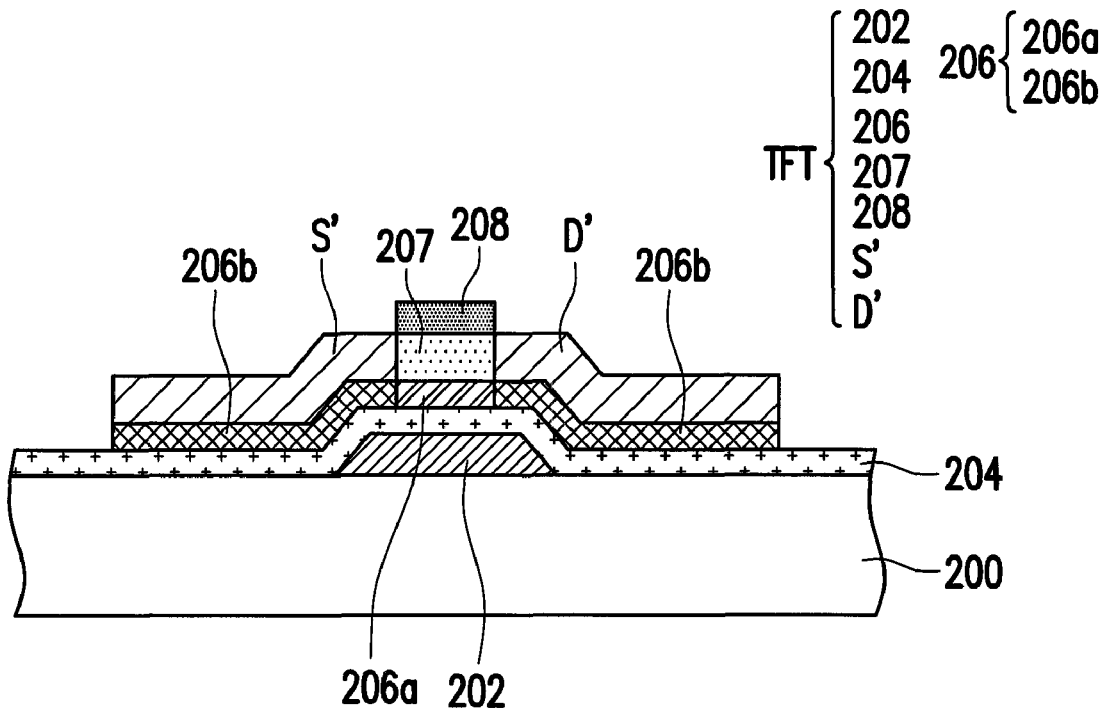
Figure 21:
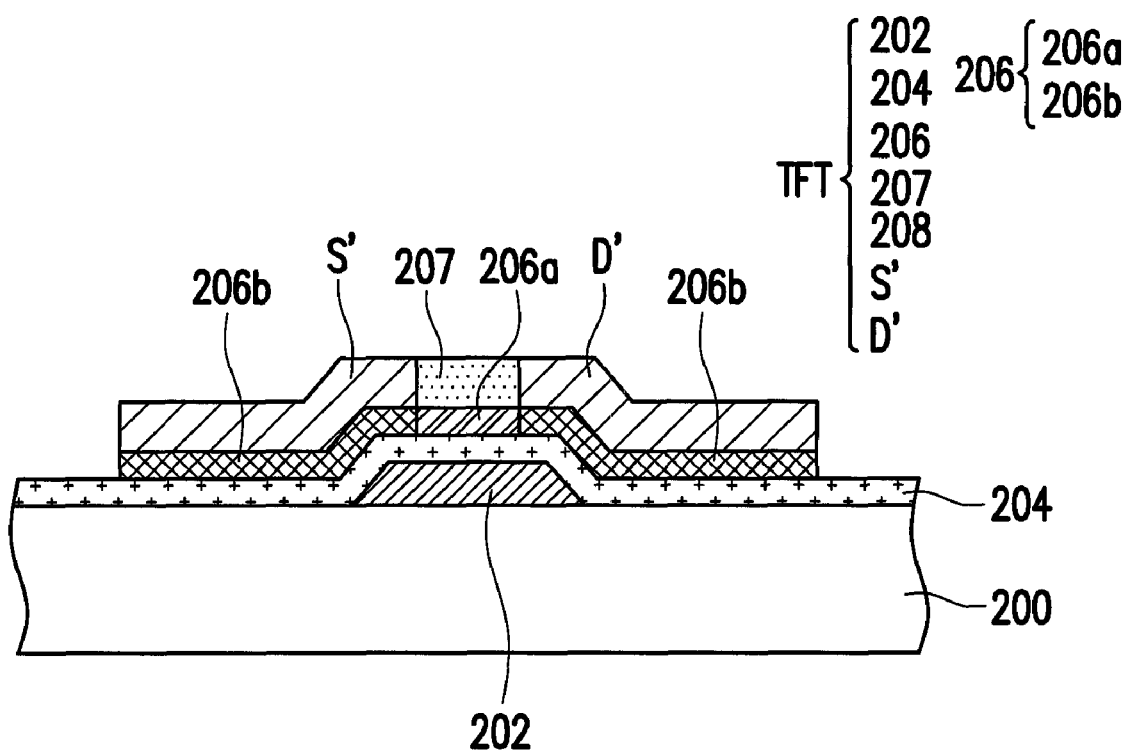

Referring to FIG. 2H, the source S' and the drain D' electrically insulated from each other are respectively formed on the ohmic contact layers 206b disposed on the portion of the gate insulation layer 204. In other embodiments, the translucent layer 208 can be removed optionally after the source S' and the drain D' are fabricated so as to form the TFT shown in FIG. 2I.

As illustrated in FIG. 2H, the TFT of the present embodiment includes the gate 202, the gate insulation layer 204, the oxide semiconductor layer 206, the dielectric layer 207, the translucent layer 208, the source S' and the drain D'. The gate insulation layer 204 covers the gate 202. The oxide semiconductor layer 206 includes the oxide channel layer 206a and the two ohmic contact layers 206b. The ohmic contact layers 206b are respectively located beside the oxide channel layer 206a and connected with the oxide channel layer 206a. The oxide semiconductor layer 206 is disposed on the gate insulation layer 204 and the oxide channel layer 206a is located above the gate 202. The dielectric layer 207 is located above the oxide channel layer 206a. The translucent layer 208 is located above the oxide channel layer 206a and the dielectric layer 207. The source S' and the drain D' are disposed on the ohmic contact layers 206b on the portion of the gate insulation layer 204 and connected with the dielectric layer 207. The source S' and the drain D' are electrically insulated from each other.

Second Embodiment

FIGS. 3A to 3E are schematic cross-sectional diagrams showing a flow chart of fabricating a TFT according to the present embodiment. Materials adopted in the composition of the TFT in the present embodiment are the same as those described in the first embodiment, and the details are omitted hereinafter.

Figure 3A:
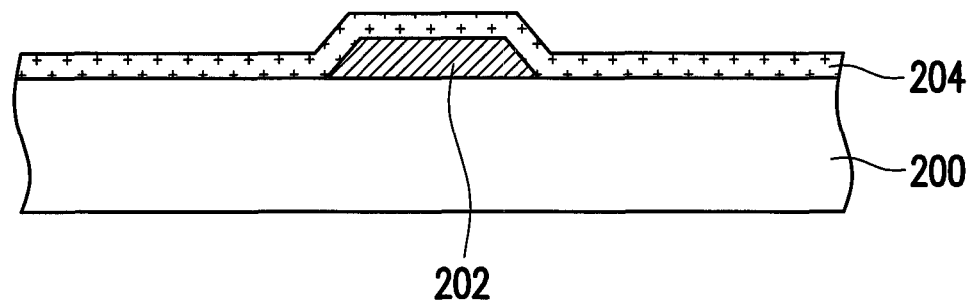
FIGS. 3A to 3E are schematic cross-sectional diagrams showing a flow chart of fabricating a TFT according to a second embodiment of the invention.

Referring to FIG. 3A, a gate 202 is formed on a substrate 200. Next, a gate insulation layer 204 is formed entirely on the substrate 200 to cover the gate 202.

Figure 3B:
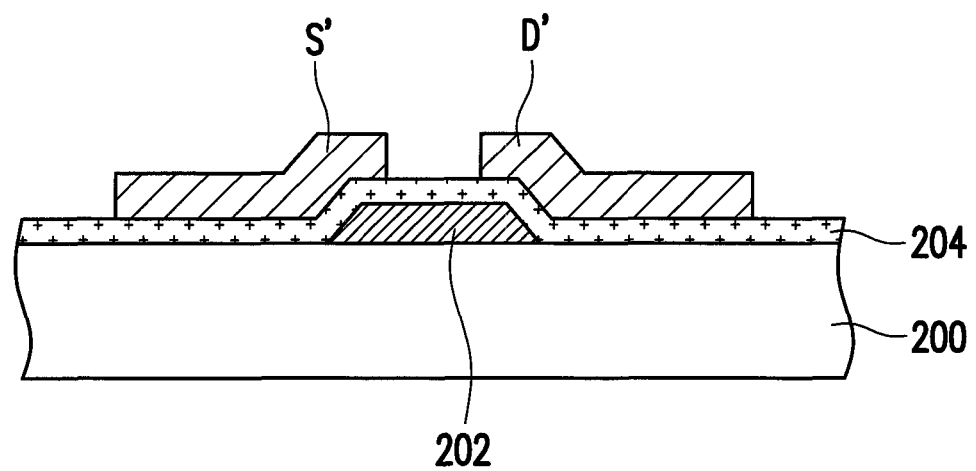

Referring to FIG. 3B, a source S' and a drain D' electrically insulated from each other are formed on a partial region of the gate insulation layer 204.

Figure 3C:
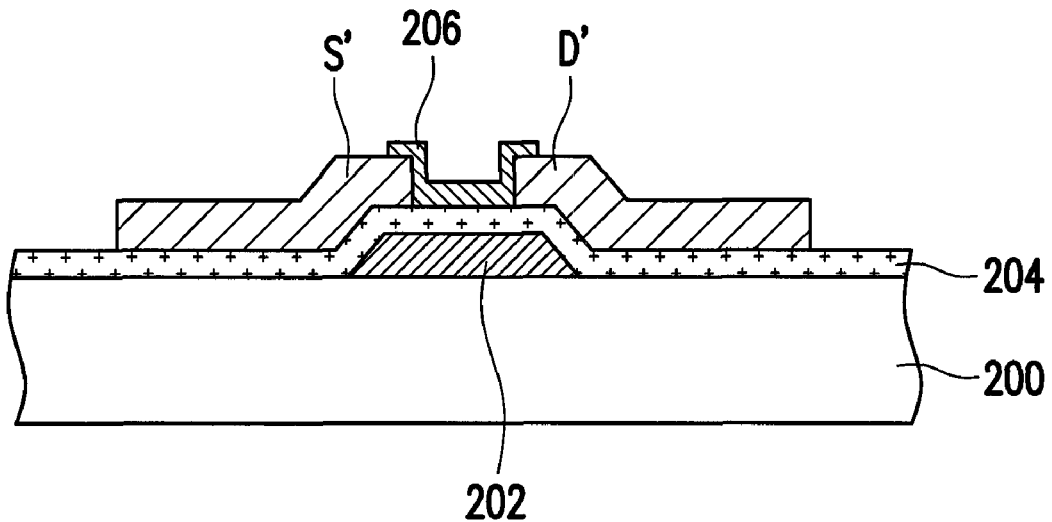

Referring to FIG. 3C, an oxide semiconductor layer 206 is formed on the gate insulation layer 204, the source S' and the drain D'. In other words, the oxide semiconductor layer 206 in the present embodiment covers a portion of the gate insulation layer 204, a portion of the source S', and a portion of the drain D' above the gate 202.

Figure 3D:
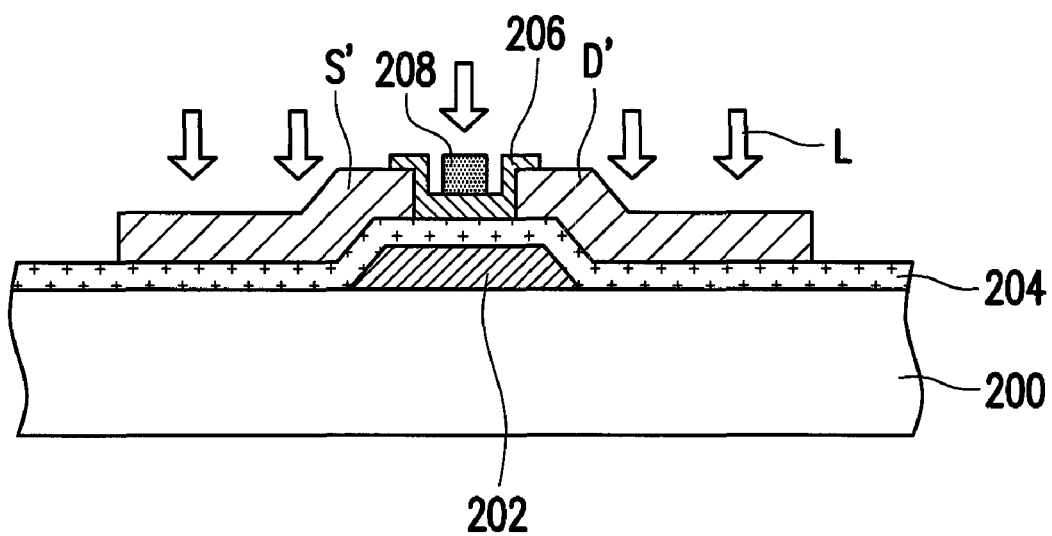

Referring to FIG. 3D, a translucent layer 208 is formed on a partial region of the oxide semiconductor layer 206.

Figure 3E:
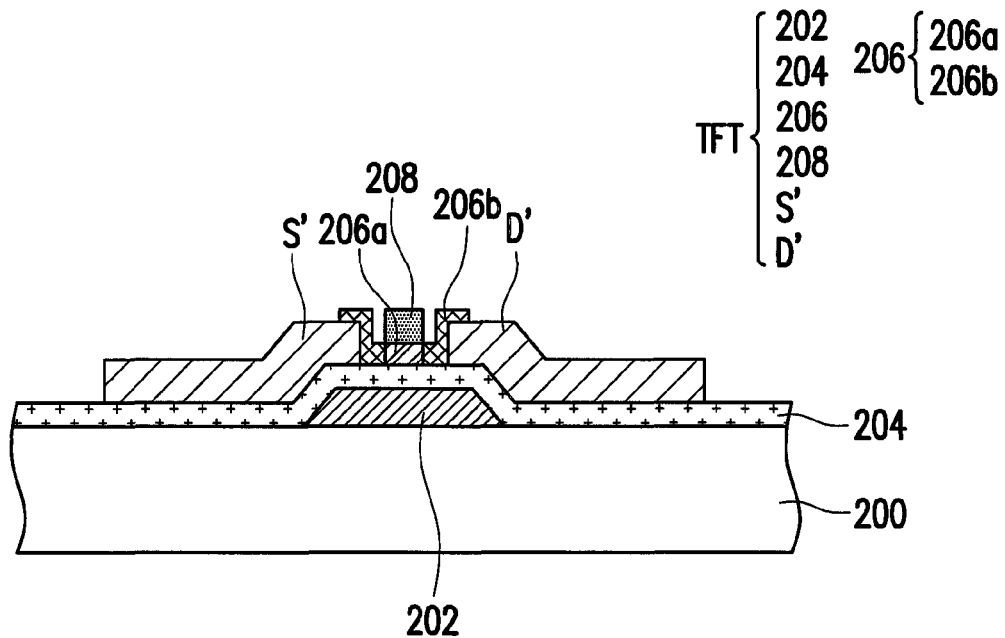

Referring to FIGS. 3D and 3E simultaneously, an optical annealing process is performed to transform the oxide semiconductor layer 206 into an oxide channel layer 206a and two ohmic contact layers 206b by using the translucent layer 208 as a mask, as depicted in FIGS. 3D and 3E. More specifically, the optical annealing process in the present embodiment, for example, is performed by irradiating the translucent layer 208 and the oxide semiconductor layer 206 with a laser beam L. Herein, the portion of the oxide semiconductor layer 206 not shielded by the translucent layer 208 receives a greater energy of the laser beam L (about the same as an energy of the incident laser beam L). On the other hand, a portion of the oxide semiconductor layer 206 shielded by the translucent layer 208 receives a smaller energy of the laser beam L. For instance, an energy of the laser beam L received by the portion of the oxide semiconductor layer 206 shielded by the translucent layer 208 decays to 10%-90% of the energy of the incident laser beam L.

In the present embodiment, the portion of the oxide semiconductor layer 206 receiving a greater energy of the laser beam L transforms into the ohmic contact layers 206b having a lower resistance, and the portion of the oxide semiconductor layer 206 receiving a smaller energy of the laser beam L transforms into the oxide channel layer 206a having stable electrical specification, as shown in FIG. 3E. Further, when a sheet resistance of the ohmic contact layers 206b is Rs1($\Omega/\square$) and a sheet resistance of the oxide channel layer 206a is Rs2($\Omega/\square$), a ratio Rs2/Rs1 of the sheet resistance Rs2($\Omega/\square$) of the oxide channel layer 206a and the sheet resistance Rs1($\Omega/\square$) of the ohmic contact layers 206b is about $10^8$. Particularly, in the present embodiment, the sheet resistance Rs1 of the ohmic contact layers 206b is about $10^4 \Omega/\square$, for example, and the sheet resistance Rs2 of the oxide channel layer 206a is about $10^{12} \Omega/\square$, for example.

It should be noted that in the present embodiment, the translucent layer 208 disposed on the partial region of the oxide semiconductor layer 206 is utilized, so that the portion of the oxide semiconductor layer 206 shielded by the translucent layer 208 and the portion not shielded by the translucent layer 208 can receive different energies of the laser beam L simultaneously. Therefore, the oxide channel layer 206a having superior electrical specification and the ohmic contact layers 206b having low resistance are formed simultaneously in the present embodiment. In addition, the thickness or the composition of the translucent layer 208 in the present embodiment can be suitably adjusted to change the ability of translucent layer 208 for decaying the laser beam L, such that the electrical specification of the oxide channel layer 206a can be optimized.

Figure 3F:
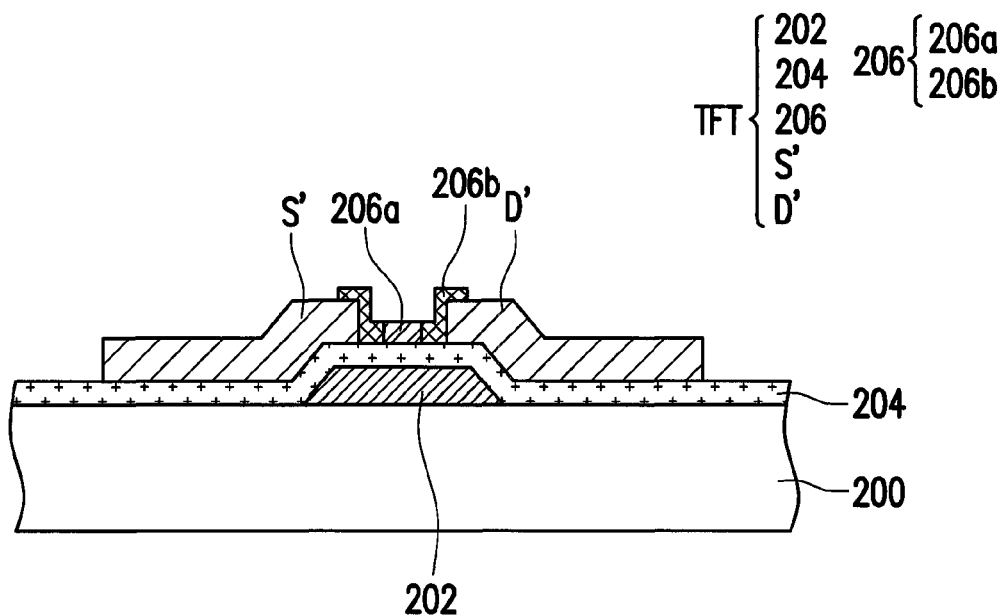
FIG. 3F is a schematic cross-sectional diagram showing a TFT according to an embodiment of the invention.

The fabrication of the TFT in the present embodiment is initially completed after the oxide channel layer 206a and the ohmic contact layers 206b are fabricated. In other embodiments, the translucent layer 208 can be removed optionally after the oxide channel layer 206a and the ohmic contact layers 206b are fabricated so as to form the TFT shown in FIG. 3F.

As shown in FIG. 3E, the TFT of the present embodiment includes the gate 202, the gate insulation layer 204, the oxide semiconductor layer 206, the translucent layer 208, the source S and the drain D. The gate insulation layer 204 covers the gate 202. The source S' and the drain D' are disposed on the portion of the gate insulation layer 204 and electrically insulated from each other. The oxide semiconductor layer 206 is disposed on the gate insulation layer 204, the source S', and the drain D'. The oxide semiconductor layer 206 includes the oxide channel layer 206a and the two ohmic contact layers 206b. The ohmic contact layers 206b are respectively located beside the oxide channel layer 206a and connected with the oxide channel layer 206a. The two ohmic contact layers 206b are connected with the source S' and the drain D' respectively. The translucent layer 208 is located above the oxide channel layer 206a.

Figure 3G:
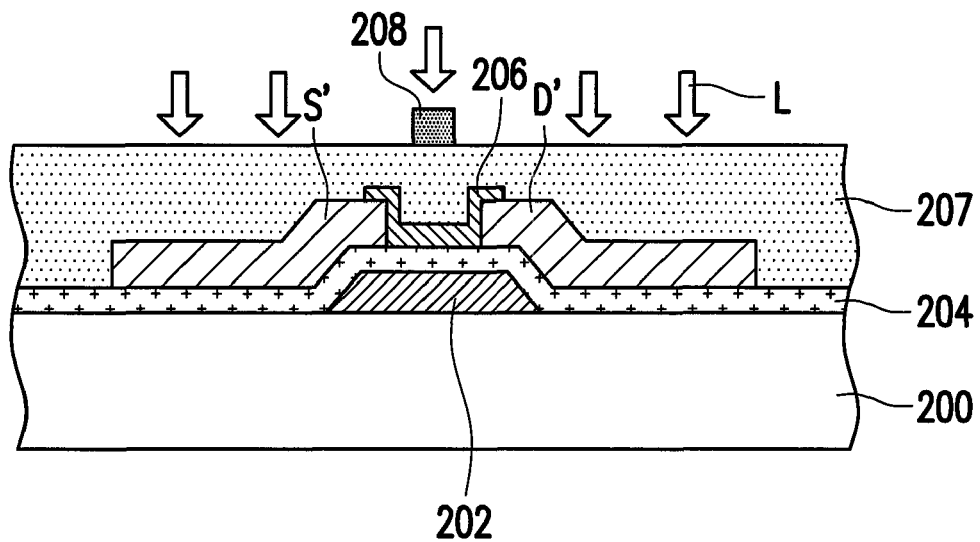
FIGS. 3G to 3H are schematic cross-sectional diagrams showing a flow chart of a partial fabrication of the TFT according to the second embodiment of the invention.

In the present embodiment, the dielectric layer 207 is formed between the translucent layer 208 and the oxide semiconductor layer 206 before the translucent layer 208 is formed, as depicted in FIG. 3G. An optical annealing process is performed to transform the oxide semiconductor layer 206 into the oxide channel layer 206a and the two ohmic contact layers 206b by using the translucent layer 208 as a mask, as depicted in FIGS. 3G and 3H.

Figure 3H:
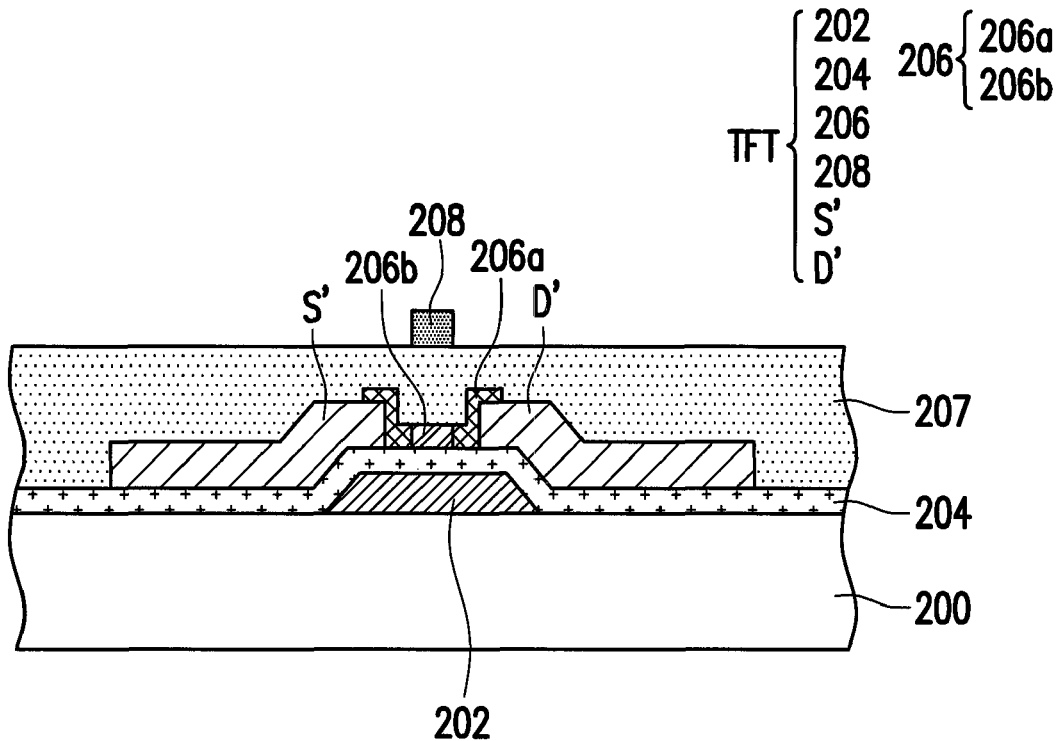

As depicted in FIG. 3H, the TFT of the present embodiment includes the gate 202, the gate insulation layer 204, the oxide semiconductor layer 206, the dielectric layer 207, the translucent layer 208, the source S' and the drain D'. The gate insulation layer 204 covers the gate 202. The source S' and the drain D' are disposed on the gate insulation layer 204 and electrically insulated from each other. The oxide semiconductor layer 206 is disposed on the gate insulation layer 204, the source S', and the drain D'. The oxide semiconductor layer 206 includes the oxide channel layer 206a and the two ohmic contact layers 206b. The ohmic contact layers 206b are respectively located beside the oxide channel layer 206a and connected with the oxide channel layer 206a. The two ohmic contact layers 206b are connected with the source S' and the drain D' respectively. The dielectric layer 207 is located above the oxide channel layer 206a, the ohmic contact layers 206b, the source S', the drain D', and the portion of the gate insulation layer 204. The translucent layer 208 is located above the dielectric layer 207 and the partial region of the oxide channel layer 206a.

In summary, an oxide channel layer having superior electrical specification and two ohmic contact layers having low resistance can be formed simultaneously through a translucent layer in the invention. Thus, the electrical specification and the mass production of the TFT in the invention can be taken into consideration at the same time.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of fabricating a thin film transistor, the method comprising:
   forming a gate on a substrate;
   forming a gate insulation layer on the substrate to cover the gate;
   forming an oxide semiconductor layer on the gate insulation layer;
   forming a translucent layer on a partial region of the oxide semiconductor layer;
   performing an optical annealing process to transform the oxide semiconductor layer into an oxide channel layer and two ohmic contact layers by using the translucent layer as a mask, wherein the oxide channel layer is located under the translucent layer, and the ohmic contact layers are respectively located beside the oxide channel layer and connected with the oxide channel layer; and
   forming a source and a drain electrically insulated from each other on the gate insulation layer and the ohmic contact layers.

2. The method of fabricating the thin film transistor as claimed in claim 1, wherein a material of the oxide semiconductor layer comprises indium gallium zinc oxide (IGZO), indium zinc oxide (IZO), indium gallium oxide (IGO), zinc oxide (ZnO), cadmium oxide·germanium dioxide ($2CdO \cdot GeO_2$), or nickel cobalt oxide ($NiCo_2O_4$).

3. The method of fabricating the thin film transistor as claimed in claim 1, wherein a material of the translucent layer comprises silicon oxide ($SiO_x$), silicon nitride ($SiN_x$), titanium oxide ($TiO_x$), indium oxide ($In_2O_3$), $InGaO_3$, InGaZnO, tin oxide ($SnO_2$), ZnO, zinc indium oxide ($Zn_2In_2O_5$), argentum (Ag), zinc tin oxide ($ZnSnO_3$), zinc tin oxide ($Zn_2SnO_4$), or amorphous silicon ($\alpha$-Si).

4. The method of fabricating the thin film transistor as claimed in claim 1, wherein the optical annealing process is performed by irradiating the translucent layer and the oxide semiconductor layer with a laser beam.

5. The method of fabricating the thin film transistor as claimed in claim 4, wherein an energy of the laser beam decays to 10%-90% after the laser beam passes through the translucent layer.

6. The method of fabricating the thin film transistor as claimed in claim 1, wherein the translucent layer comprises a translucent light-shielding layer or a translucent light-absorption layer.

7. The method of fabricating the thin film transistor as claimed in claim 1, wherein a sheet resistance of the ohmic contact layers is $Rs1(\Omega/\square)$, a sheet resistance of the oxide channel layer is $Rs2(\Omega/\square)$, and Rs2/Rs1 is about $10^8$.

8. The method of fabricating the thin film transistor as claimed in claim 7, wherein Rs1 is about $10^4 \Omega/\square$ and Rs2 is about $10^{12} \Omega/\square$.

9. The method of fabricating the thin film transistor as claimed in claim 1, further comprising forming a dielectric layer between the translucent layer and the oxide semiconductor layer.

10. A method of fabricating a thin film transistor, the method comprising:
    forming a gate on a substrate;
    forming a gate insulation layer on the substrate to cover the gate;
    forming a source and a drain electrically insulated from each other on the gate insulation layer;
    forming an oxide semiconductor layer on the gate insulation layer, the source, and the drain;
    forming a translucent layer on a partial region of the oxide semiconductor layer; and
    performing an optical annealing process to transform the oxide semiconductor layer into an oxide channel layer and two ohmic contact layers by using the translucent layer as a mask, wherein the oxide channel layer is located under the translucent layer, and the ohmic contact layers are respectively located beside the oxide channel layer and connected with the oxide channel layer.

11. The method of fabricating the thin film transistor as claimed in claim 10, wherein a material of the oxide semiconductor layer comprises IGZO, IZO, IGO, ZnO, $2CdO \cdot GeO_2$, or $NiCo_2O_4$.

12. The method of fabricating the thin film transistor as claimed in claim 10, wherein a material of the translucent layer comprises $SiO_x$, $SiN_x$, $TiO_x$, $In_2O_3$, $InGaO_3$, InGaZnO, $SnO_2$, ZnO, $Zn_2In_2O_5$, Ag, $ZnSnO_3$, $Zn_2SnO_4$, or $\alpha$-Si.

13. The method of fabricating the thin film transistor as claimed in claim 10, wherein the optical annealing process is performed by irradiating the translucent layer and the oxide semiconductor layer with a laser beam.

14. The method of fabricating the thin film transistor as claimed in claim 13, wherein an energy of the laser beam decays to 10%-90% after the laser beam passes through the translucent layer.

15. The method of fabricating the thin film transistor as claimed in claim 10, wherein the translucent layer comprises a translucent light-shielding layer or a translucent light-absorption layer.

16. The method of fabricating the thin film transistor as claimed in claim 10, wherein a sheet resistance of the ohmic contact layers is $Rs1(\Omega/\square)$ sheet resistance of the oxide channel layer is $Rs2(\Omega/\square)$, and Rs2/Rs1 is about $10^8$.

17. The method of fabricating the thin film transistor as claimed in claim 16, wherein Rs1 is about $10^4 \Omega/\square$ and Rs2 is about $10^{12 \Omega/\square}$.

18. The method of fabricating the thin film transistor as claimed in claim 10, further comprising forming a dielectric layer between the translucent layer and the oxide semiconductor layer before the translucent layer is formed.

* * * * *